(12) United States Patent
Shin

(10) Patent No.: US 8,242,577 B2
(45) Date of Patent: Aug. 14, 2012

(54) FUSE OF SEMICONDUCTOR DEVICE AND METHOD FOR FORMING THE SAME

(75) Inventor: Yun Ho Shin, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 149 days.

(21) Appl. No.: 12/816,271

(22) Filed: Jun. 15, 2010

(65) Prior Publication Data

US 2011/0140234 A1 Jun. 16, 2011

(30) Foreign Application Priority Data

Dec. 10, 2009 (KR) .................. 10-2009-0122253

(51) Int. Cl.
*H01L 23/52* (2006.01)
*H01L 21/82* (2006.01)
*H03H 11/26* (2006.01)

(52) U.S. Cl. ......... 257/529; 257/E23.149; 257/E21.592; 438/132; 327/290

(58) Field of Classification Search .................. 257/529, 257/211, E23.149, E21.592; 438/601, 132, 438/637; 327/142, 290, 297
See application file for complete search history.

(56) References Cited

U.S. PATENT DOCUMENTS

2003/0141568 A1* 7/2003 Sato et al. .................. 257/529
2008/0179706 A1* 7/2008 Kim et al. .................. 257/529

* cited by examiner

*Primary Examiner* — A. Sefer
*Assistant Examiner* — Nikolay Yushin

(57) ABSTRACT

A fuse of a semiconductor device comprises: a first insulating film formed over a semiconductor substrate; a conductive pattern formed over the first insulating film; a fuse metal formed over the conductive pattern; a contact plug electrically coupling the conductive pattern and the fuse metal; and an energy absorbent pattern formed in the first insulating film and located below an area where the contact plug and the conductive pattern are interconnected. The fuse of the semiconductor device includes a void and a step difference in the lower portion of the contact connected to the fuse pattern. As a result, an energy of a laser applied in the blowing process is absorbed in the void or the step difference, which does not affect peripheral patterns, thereby preventing defects.

16 Claims, 4 Drawing Sheets

FUSE OF SEMICONDUCTOR DEVICE AND METHOD FOR FORMING THE SAME

CROSS-REFERENCE TO RELATED APPLICATION

The priority of Korean patent application No. 10-2009-122253 filed on Dec. 10, 2009, the disclosure of which is hereby incorporated in its entirety by reference, is claimed.

BACKGROUND OF THE INVENTION

The present invention relates to a fuse of a semiconductor device and a method for forming using the same, and more specifically, to a fuse of a semiconductor device and a method for forming using the same that may prevent damage of the lower layer from misalignment due to lack of a blowing margin.

A semiconductor device such as a memory device and a memory merged logic (MML) includes a plurality of memory cells for storing data. If even one memory cell in a memory array of a semiconductor device has a defect, the whole device is not able to serve as a memory since the whole device becomes defective. However, if a whole memory device is discarded when it is determined to contain a defective memory cell, it significantly lowers a manufacturing yield.

In order to improve a manufacturing yield of a semiconductor device including a memory device or a memory, a repair method is required. The repair method in the semiconductor device is performed by replacing a defective memory cell with a redundancy memory cell. In order to replace a defective memory cell with a redundancy memory cell, a fuse is used. Specifically, a semiconductor device is configured to include a plurality of fuses, and these fuses can be cut using a laser. A test is performed to determine whether a defective memory cell exists in a given semiconductor device, and then the fuses are selectively cut depending on the test result.

In the repair method using a redundancy cell, each cell array comprises a redundancy word line and a redundancy bit line, and when a defect is found in a specific cell, the normal word line or the normal bit line is substituted with the redundancy word line or the redundancy bit line. In a memory device, when a defective cell is identified through a test, circuit lines are reconfigured to substitute an existing address corresponding to the defective cell with a new address corresponding to a redundancy cell. As a result, when an address signal corresponding to the defective cell is inputted, the substituted redundancy cell corresponding to the defective cell is activated.

Of the above-described repair methods, a widely used method is to blow a fuse with a laser beam, thereby performing cell substitution. For this operation, a general memory device has a fuse unit configured to substitute an existing address path with a new address path by blowing the fuse of a defective cell using a laser. A wire designed to be disconnected by laser irradiation is referred to as a metal fuse, and the disconnection site and its surrounding region are referred to as a fuse box.

BRIEF SUMMARY OF THE INVENTION

Various embodiments of the invention are directed to prevent defects resulting from removal of a bit line metal in a longitudinal direction when a laser energy is transmitted through a contact due to lack of a blowing margin to cut the fuse.

According to an embodiment of the present invention, a first insulating film formed over a semiconductor substrate; a conductive pattern formed over the first insulating film; a fuse metal formed over the conductive pattern; a contact plug electrically coupling the conductive pattern and the fuse metal; and an energy absorbent pattern formed in the first insulating film and located below an area where the contact plug and the conductive pattern are interconnected.

The energy absorbent pattern is a trench.
The trench has a ratio of width:depth of 1:3~1:10.
The insulating film is an undoped silicate glass (USG).
The metal line is a bit line electrode.
The conductive pattern has a step shape.
The conductive pattern has a multiple steps.
The trench is void of material.
The fuse of semiconductor device further comprise a second insulating film that extends at least partly over an opening of the trench without filling the trench.
The trench includes one or more slits.
The energy absorbent pattern is configured such as to absorb excessive energy applied into the conductive pattern to prevent the conductive pattern from being damage.

According to an embodiment of the present invention, a method for forming a fuse of a semiconductor device comprises: forming a first insulating film formed over a semiconductor substrate; forming a conductive pattern formed over the first insulating film; forming a fuse metal formed over the conductive pattern; forming a contact plug electrically coupling the conductive pattern and the fuse metal; and forming an energy absorbent pattern formed in the first insulating film and located below an area where the contact plug and the conductive pattern are interconnected.

The energy absorbent pattern includes a trench.
The conductive pattern has a step shape.
The energy absorbent pattern has a trench is void of material.
The insulating film includes an undoped silicate glass (USG).
The method for forming a fuse of a semiconductor device further comprises: forming a second insulating film extending at least partly over an opening the trench, the trench being substantially free of the second insulating film.
The trench includes one or more slits.
The first insulating film defines a plurality of steps.
The energy absorbent pattern is configured to absorb excessive energy applied onto the conductive pattern and prevent the conductive pattern from damage.

DESCRIPTION OF EMBODIMENTS

The present invention will be described in detail with reference to the attached drawings.

FIGS. 1a to 1f are cross-sectional diagrams illustrating a method for forming a fuse of a semiconductor device according to an embodiment of the present invention.

Figure 1A:
FIGS. 1a to 1f are cross-sectional diagrams illustrating a method for forming a fuse of a semiconductor device according to an embodiment of the present invention.

Referring to FIG. 1a, a first insulating film 102 is formed on a semiconductor substrate 100. The first insulating film 102 includes a borophophosilicate glass (BPSG).

Figure 1B:
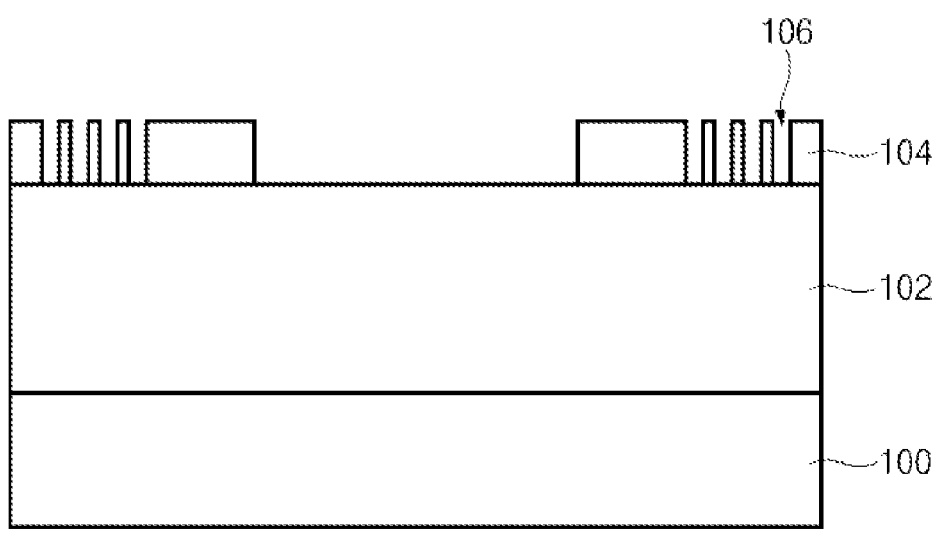

Referring to FIG. 1b, a photoresist pattern 104 is formed on the first insulating film 102. The photoresist pattern 104 is formed with a given interval. A space pattern 106 having a slit shape is formed in the photoresist pattern 104. In a subsequent process, the first insulating film 102 is etched using the photoresist pattern 104 as an etching mask.

Figure 1C:
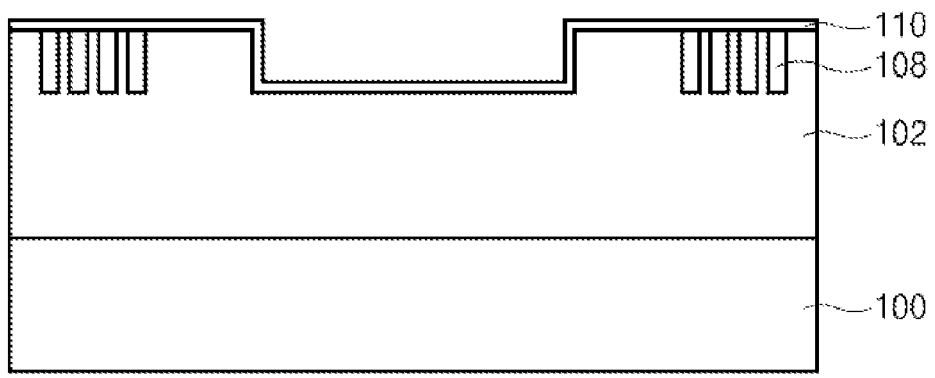

Referring to FIG. 1c, the first insulating film 102 is etched with the photoresist pattern 104 as an etching mask. During this etching process, a first trench (or energy absorbent pattern) 108 having one or more slits is made in the first insulating film 102. As used herein, the term "trench" may includes one or more recesses defined in a material. Although used a singular, the "trench" accordingly may includes a plurality of smaller slits or trenches. A second insulating film 110 is formed on the first insulating film 102. The second insulating film 110 includes an undoped silicate glass (USG) having a low step coverage. Since the second insulating film 110 having a low step coverage does not fill in the trench 108 (having a slit shape), the second insulating film 110 is formed on the first insulating film 102 hanging over the first trench 108. The first trench is formed of one or more slits with a narrow width so that the second insulating film 110 may not be filled in the slits of the first trench 108. For example, the trench 108 may be formed of slits with a ratio of width:depth of 1:3~1:10. In this case, the second insulating film 110 is formed hanging over the slits, so that a void is formed in the first trench 108.

Figure 1D:
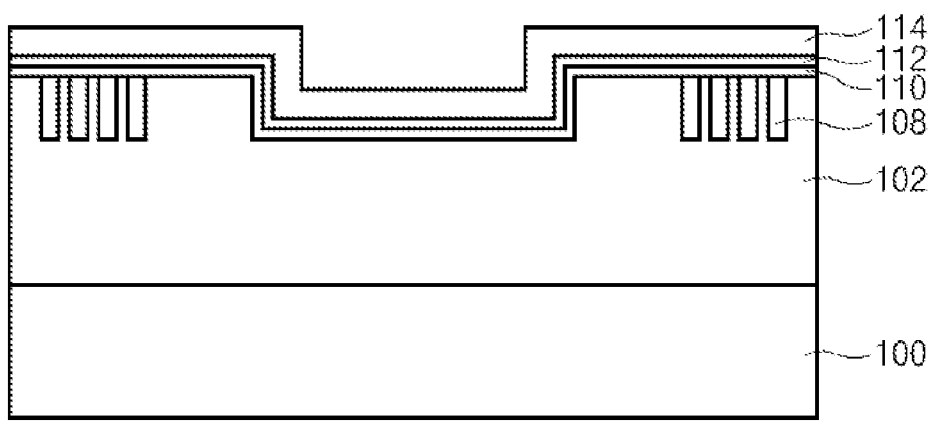

Referring to FIG. 1d, a barrier metal 112 and a bit line electrode 114 are formed on the resultant structure. The barrier metal 112 may include Ti, TiN and Glue TiN, and the bit line electrode 114 may include tungsten.

Figure 1E:
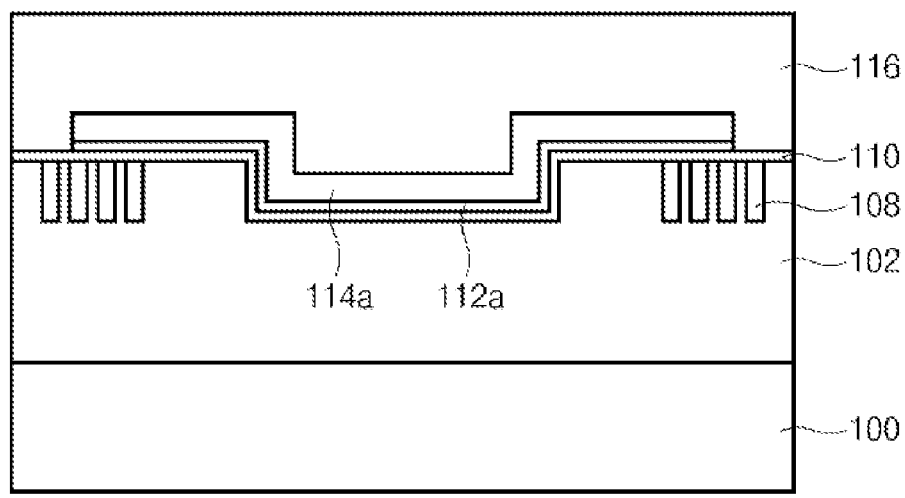

Referring to FIG. 1e, after a photoresist pattern (not shown) is formed on the bit line electrode 114, the bit line electrode 114 and the barrier metal 112 are patterned with the photoresist pattern as an etching mask. The bit line electrode 114 and the barrier metal 112 are patterned to expose a portion of the second insulating film 110 over the first trench 108 formed in the first insulating film 102. As a result, a stepped bit line electrode pattern 114a and a stepped barrier metal pattern 112a are obtained. A third insulating film 116 is formed on the bit line electrode 114a and the second insulating film 110.

Figure 1F:
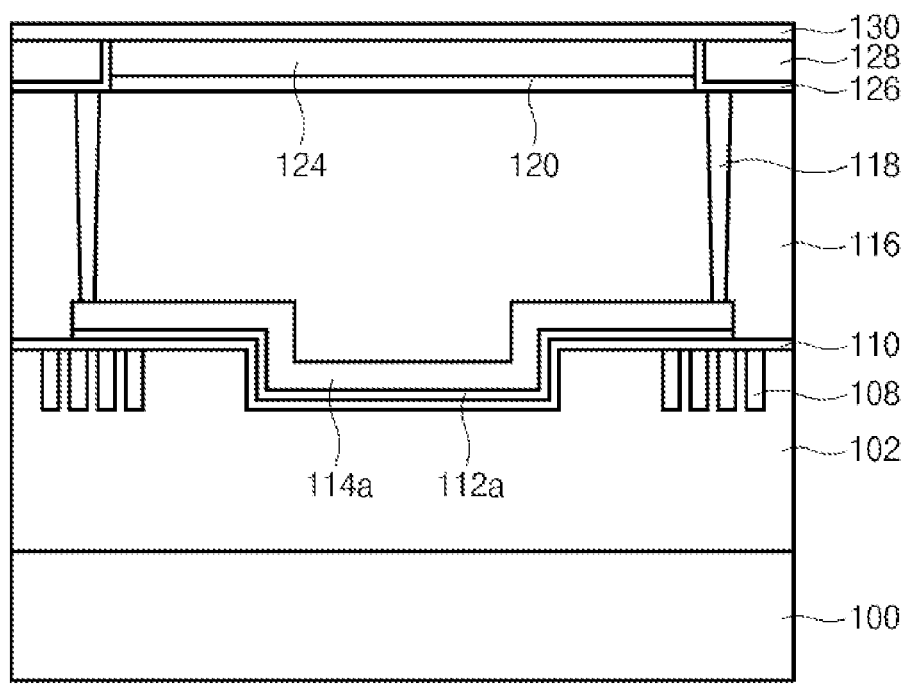

Referring to FIG. 1f, after the third insulating film 116 is patterned to form a contact hole exposing the bit line electrode 114a, a contact plug 118 is formed filing up the contact hole. A trench nitride film 120 and a fourth insulating film 124 are formed on the third insulating film 116 including the contact plug 118. The fourth insulating film 124 and the trench nitride film 120 are etched to expose the contact plug 118, thereby obtaining a second trench. A barrier metal 126 is formed on the surface of the second trench. A fuse metal 128 filling up the second trench is formed. A damascene nitride film 130 is formed on the fourth insulating film 124, the barrier metal 126 and the fuse metal 128.

Figure 2:
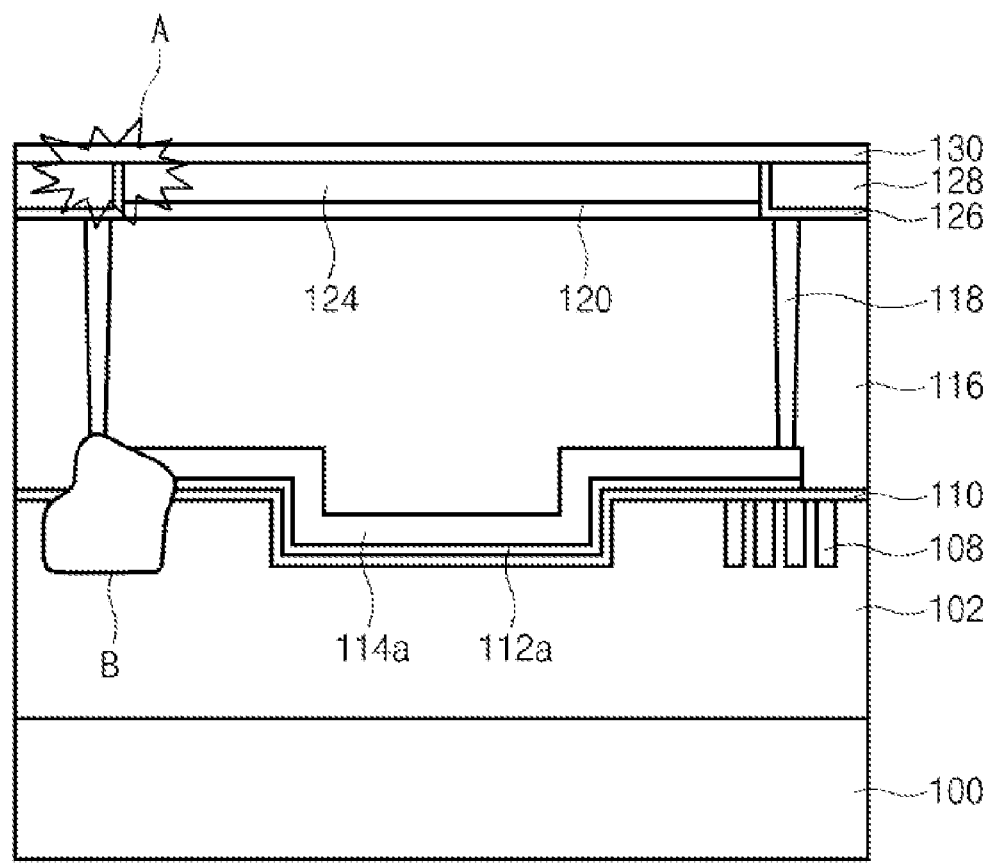
FIG. 2 is a cross-sectional diagram illustrating when a laser is applied to a fuse of the semiconductor device according to an embodiment of the present invention.

FIG. 2 is a cross-sectional diagram illustrating when a laser is applied to a fuse of the semiconductor device according to an embodiment of the present invention.

As shown in FIG. 2, when a laser is misaligned due to a narrow margin and applied not to the center of the fuse metal 128 but to the contact plug 118 (A), a laser energy is transmitted to the bit line electrode pattern 114a through the contact plug 118. The laser energy transmitted to the bit line electrode pattern 114a is absorbed by the trench 108 formed in the first insulating film 102, and thereby the destruction area due to a misaligned laser is limited to the first insulating film 102 and the trench 108 (B). As a result, the laser energy is not transmitted further in a direction along the bit line electrode pattern 114a, thereby preventing disconnection of the whole bit line electrode pattern 114a. Even when the laser energy is transmitted in the direction along the bit line electrode pattern 114a, the configuration of the bit line electrode pattern 114a in a stepped form is effectively resistant to disconnection of the whole bit line electrode pattern 114a, compared with a conventional bit line pattern in a planar form. As a result, the laser energy transmitted to the bit line electrode pattern 114a is minimized and thus may prevent defects due to bit line disconnection.

In conclusion, a fuse configuration of a semiconductor device and a method for forming using the same according to the embodiments of the present invention prevents defects resulting from a bit line pattern destruction when a laser for blowing a fuse erroneously attacks a bit line contact.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A fuse of a semiconductor device comprising:
   a first insulating film formed over a semiconductor substrate;
   a conductive pattern formed over the first insulating film;
   a fuse metal formed over the conductive pattern;
   a contact plug electrically coupling the conductive pattern and the fuse metal;
   an energy absorbent pattern formed in the first insulating film and located below an area where the contact plug and the conductive pattern are interconnected; and
   a second insulating film that extends at least partly over an opening of the trench without filling the trench,
   wherein the energy absorbent pattern is a trench.

2. The fuse of the semiconductor device according to claim 1, wherein the trench has a ratio of width:depth of 1:3~1:10.

3. The fuse of the semiconductor device according to claim 1, wherein the first insulating film includes an undoped silicate glass (USG).

4. The fuse of the semiconductor device according to claim 1, wherein the conductive pattern is a bit line electrode.

5. The fuse of the semiconductor device according to claim 1, wherein the conductive pattern has a step shape.

6. The fuse of the semiconductor device according to claim 1, wherein the conductive pattern has multiple steps.

7. The fuse of the semiconductor device according to claim 1, wherein the trench is void of material.

8. The fuse of the semiconductor device according to claim 1, wherein the trench includes one or more slits.

9. The fuse of the semiconductor device according to claim 1, wherein the energy absorbent pattern is configured to absorb excessive energy applied to the conductive pattern to prevent the conductive pattern from being damaged.

10. A method for forming a fuse of a semiconductor device, the method comprising:
    forming a first insulating film over a semiconductor substrate;
    forming a conductive pattern over the first insulating film;
    forming a fuse metal over the conductive pattern;
    forming a contact plug electrically coupling the conductive pattern and the fuse metal;

forming an energy absorbent pattern in the first insulating film below an area where the conductive pattern and the contact plug are interconnected; and forming a second insulating film extending at least partly over an opening the trench, the trench being substantially free of the second insulating film, wherein the energy absorbent pattern includes a trench.

11. The method according to claim 10, wherein the conductive pattern has a step shape.

12. The method according to claim 10, wherein the energy absorbent pattern has a trench that is void of material.

13. The method according to claim 10, wherein the first insulating film includes an USG.

14. The method according to claim 10, wherein the trench includes one or more slits.

15. The method according to claim 10, wherein the first insulating film defines a plurality of steps.

16. The method according to claim 10, wherein the energy absorbent pattern is configured to absorb excess energy applied to the conductive pattern and prevent the conductive pattern from being damaged.

* * * * *